United States Patent
Spatz et al.

(10) Patent No.: US 8,192,668 B2
(45) Date of Patent: Jun. 5, 2012

(54) STRUCTURING METHOD AND COMPONENT WITH A STRUCTURED SURFACE

(75) Inventors: Joachim Spatz, Heidenheim (DE); Stefan Graeter, Esslingen (DE)

(73) Assignee: Max-Planck-Gesellschaft zur Foerderung der Wissenschaften e.V. (DE)

( * ) Notice: Subject to any disclaimer, the term of this patent is extended or adjusted under 35 U.S.C. 154(b) by 744 days.

(21) Appl. No.: 12/279,926

(22) PCT Filed: Feb. 14, 2007

(86) PCT No.: PCT/EP2007/001285
§ 371 (c)(1),
(2), (4) Date: Oct. 17, 2008

(87) PCT Pub. No.: WO2007/096082
PCT Pub. Date: Aug. 30, 2007

(65) Prior Publication Data
US 2009/0053472 A1    Feb. 26, 2009

(30) Foreign Application Priority Data
Feb. 20, 2006  (DE) .......................... 10 2006 007 800

(51) Int. Cl.
*B29C 59/00*    (2006.01)
(52) U.S. Cl. ..................................................... 264/293
(58) Field of Classification Search .................. 264/293
See application file for complete search history.

(56) References Cited

U.S. PATENT DOCUMENTS

| | | | |
|---|---|---|---|
| 3,390,403 A | 6/1968 | Van Tilburg | |
| 3,557,407 A * | 1/1971 | Lemelson | ........................ 425/71 |
| 4,451,419 A | 5/1984 | Bye et al. | |
| 6,737,160 B1 | 5/2004 | Full et al. | |
| 2004/0118809 A1 | 6/2004 | Chou et al. | |
| 2004/0182820 A1* | 9/2004 | Motowaki et al. | ............... 216/44 |
| 2005/0136217 A1 | 6/2005 | Barthlott et al. | |

(Continued)

FOREIGN PATENT DOCUMENTS

DE    103 53 697 A1    6/2005

(Continued)

OTHER PUBLICATIONS

Spina et al., A novel technological process for fabricating micro-tips for biomimetic adhesion, J Micromech Microeng 15 (2005) 1576-1587.*

(Continued)

*Primary Examiner* — Christina Johnson
*Assistant Examiner* — Galen Hauth
(74) *Attorney, Agent, or Firm* — Schnader Harrison Segal & Lewis LLP (57) ABSTRACT

A method for producing a structured surface (10) which has a plurality of filamentary projections (11), comprises the steps of mutual contacting of a stamp face (21.1, 21.2) and a pattern face (31.1, 31.2), whereas at least one of the stamp face (21.1, 21.2) and the pattern face (31.1, 31.2) having a flowable substance (20), separation movement of the stamp face (21.1, 21.2) and the pattern face (31.1, 31.2), whereas connecting filament strands (22) of the flowable substance (20) are drawn between the stamp face (21.1, 21.2) and the pattern face (31.1, 31.2), and interruption of the connecting filament strands (22), so that the filamentary projections (11) are formed on at least one of the stamp face (21.1, 21.2) and the pattern face (31.1, 31.2). Components (100) that are produced by this method are described.

30 Claims, 7 Drawing Sheets

U.S. PATENT DOCUMENTS

| | | |
|---|---|---|
| 2005/0288469 A1 | 12/2005 | Higuchi et al. |
| 2006/0005362 A1 | 1/2006 | Arzt et al. |
| 2007/0098957 A1 | 5/2007 | Barthlott et al. |

FOREIGN PATENT DOCUMENTS

| | | |
|---|---|---|
| GB | 889783 | 2/1962 |
| GB | 2 223 452 A | 4/1990 |
| WO | 2004/063815 A2 | 7/2004 |
| WO | WO 2004/063815 | 7/2004 |
| WO | 2005/049479 A3 | 6/2005 |

OTHER PUBLICATIONS

International Search Report for PCT Patent Application No. PCT/EP2007/001285, dated Jun. 18, 2007.

Zen Yoshimitsu, Akira Nakajima, Toshiya Watanabe, and Kazuhito Hashimoto; Effects of Surface Structure on the Hydrophobicity and Sliding Behavior of Water Droplets; Langmuir 2002, vol. 18, pp. 5812-5818.

Ralph Spolenak, Stanislav Gorb and Eduard Arzt; Adhesion Design Maps for Bio-inspired Attachment Systems; Acta Biomaterialia 1 2005, pp. 5-13.

G. La Spina, C. Stefanini, A. Menciassi and P. Dario; A Novel Technological Process for Fabricating Micro-tips for Biomimetic Adhesion; Journal of Micromechanics and Microengineering, 2005, pp. 1576-1587.

Hoon Eui Jeong, Sung Hoon Lee, Pilnam Kim and Kahp Y. Suh; Stretched Polymer Nanohairs by Nanodrawing; Nano Letters, vol. 6, No. 7, pp. 1508-1513 (2006).

D.J. Crisp and W.H. Thorpe; The Water-Protecting Properties of Insect Hairs; Discussions of the Faraday Society London, vol. 3, 1948, pp. 210-220.

Machine translation of German Patent No. DE10353697, published Jun. 23, 2005, Joachim Spatz.

* cited by examiner

STRUCTURING METHOD AND COMPONENT WITH A STRUCTURED SURFACE

The invention relates to a method for producing a structured surface comprising a plurality of filamentary projections, and to a component produced with this method.

It is known that boundary surface properties, optical properties or electrical properties of surfaces can be modified by a surface structuring. In practice, especially structures with typical dimensions in the μm- to nm range, e.g., on surfaces of electronic or optical components, sensors and the like are of interest. For example, microstructured surfaces are described by Z. Yoshimitsu ("Langmuir" vol. 18, 2002, pp. 5818-5812) with which a liquid moistening can be suppressed. For water drops a contact angle above 150° can be achieved with an arrangement of columns with a thickness of 50 μm and a height of 148 μm on a surface. Furthermore, the achieving of a mutual adhering of surfaces that contact each other by a structuring is known (see U.S. Pat. No. 6,737,160, or Arzt et al. in "Acta Biomat." vol. 1, 2005, pp. 5-13, DE 102 23 234). Even the so-called lotus effect (see, e.g., EP 1 171 529 B1) is explained with the cooperation of the chemical composition of a surface with its microstructuring.

The effects of surface structures were previously usually described in the framework of experiments in the laboratory. However, a routine application in practice was previously possible only to a limited extent. Thus, the production of a structured surface with a mass arrangement of filamentary projections with photolithographic techniques or etching methods has the following disadvantages. In the first place the methods are associated with a high technical complexity. The structuring of extended surfaces would lead to extremely high costs. Furthermore, projections with typical dimensions in the nanometer range (<1 μm), having typically only low aspect ratios (ratio length: diameter of the projections) below 20 are achieved with the cited techniques. However, for numerous applications an aspect ratio of up to 100 or above is desired. Finally, photolithography and the etching method offer only a limited variability in the adjusting of a certain orientation or form of the surface structures, as is of interest, e.g., for the cited adhesion effect. Moreover, projections with substructures such as, e.g., thickness gradients or pre-determined material compositions can be produced only in a limited manner with the conventional techniques.

DE 103 53 697 describes a casting method for the production of a structured surface with column-shaped elevations of polymer materials. This method does achieve an elevation of the aspect ratio. However, the high technical complexity of the method and the limitation to elevations with a straight form are disadvantageous.

The invention has the objective of providing an improved method for producing a structured surface with which the disadvantages of the conventional techniques are overcome. The method in accordance with the invention should be able to be realized with low costs even in the case of extended surfaces and should have an expanded range of application. It should make possible in particular a high variability in the adjusting of geometric, electrical, optical and/or mechanical properties of the surface structure and in particular structures with an enlarged aspect ratio. The invention also has the objective of providing an improved component with a structured surface that can be produced with reduced technical complexity and reduced costs and makes possible a high variability in the adjusting of physical or chemical properties of the surface.

These objectives are solved by a method or a component with the features of patent claims 1 and 25. Advantageous embodiments and applications of the invention result from the dependent claims.

As concerns the method, the invention is based on the general technical teaching of providing a surface with filamentary projections in that a flowable substance is drawn out between a stamp face and a pattern face and the connecting filament strands are interrupted. The pattern face carries a predetermined geometric pattern of surface modifications of a chemical or topographical type. The pattern forms the model for the filamentary projections to be produced. The stamp face has a geometrically non-structured surface. The pattern face and the stamp face have forms that fit one another in such a manner that both faces contact one another at least in partial areas upon reciprocal approach, whereas the partial areas can have an areal or line-shaped extent.

The flowable substance that is provided in or on one or both of the stamp and pattern faces moistens the particular other face by a reciprocal contacting of the pattern face and the stamp face. If the pattern face and the stamp face move relative to one another so that both faces are separated from one another, the connecting filament strands are spread as free-carrying liquid bridges. The surface shape of the connecting filament strands is determined in particular by the viscosity of the substance and the surface tension of the substance in the spread state.

According to a first embodiment of the invention, the stamp face is formed by a free surface (fluid face) of the flowable substance from which the connecting filament strands are drawn with the pattern face and a hardening of the flowable substance is provided during or after the drawing. After a separation of the pattern face and the fluid face with an interruption of the connecting filament strands the desired filamentary projections remain on the fluid face, the pattern face or both faces.

According to a second embodiment of the invention, the stamp face is formed by a surface of a solid body (solid body face) whereas the pattern face carries the flowable substance. The flowable substance is arranged on the pattern face with a certain geometric distribution on the partial areas (islands) separated from each other and forms the model for the arrangement of the filamentary projections. During the contacting of the solid body face and the pattern face the flowable substance adheres to the solid body face so that during the subsequent separation movement of both faces at first the connecting filament strands are spread and upon their interruption the filamentary projections are formed on one of the solid body faces and pattern faces. The second embodiment of the invention has the particular advantage that the provision of a reservoir of the flowable substance can be avoided.

All filamentary projections can advantageously be produced at the same time during the withdrawal of the pattern face and the interruption of the connecting filament strands. This method is significantly simpler than the conventional structuring techniques and can be used without problems even in the case of extended faces in the $dm^2$- to $m^2$ range or above this range. A further important advantage of the method in accordance with the invention is that the filamentary projections can be produced with an extremely high length-diameter aspect ratio. Given sufficiently high viscosity the connecting filament strands between the fluid face and the pattern face can have a length that is, e.g., 500 times higher than the diameter of the connecting filament strand.

As concerns the device, the above objective is solved in accordance with the general technical teaching of providing a component that comprises a base face with a plurality of filamentary projections of a flowable, hardenable substance, which filamentary projections have a contour (surface form) formed by the surface tension of the substance in the flowable state. The contour of the filamentary projections corresponds at least in sections or locally to a form that the substance assumes in the flowable state freely spread between two faces.

The invention provides a method for the production of a mass arrangement of filamentary projections on a face. The term "filamentary projection" designates here an elongated structure that rises up from a base face to a free end. The structure generally has the form of a column, fiber, needle, rod or hair. The filamentary projections form structures with a length in a range of a few 10 nm (e.g., 100 nm) to a few centimeters (e.g., 3 cm) and a diameter of a few nanometers (e.g., 10 nm) to a few millimeters (e.g., 5 mm). The term "flowable substance" denotes here all liquid materials that can be spread (tensioned) in a filamentary manner between two bodies and retain their form in the spread state. The flowability is given in particular at the operating temperature at which the method of the invention is carried out. A "structured surface" is a face area of an object that carries a plurality of the filamentary projections.

Advantageously, aside from the congruence with the fluid face, no particular requirements are placed on the pattern face for drawing the connecting filament strands. If the pattern face has, for example, a smooth surface, the arrangement of the filamentary projections can take place randomly or by self-organization. However, for an improved control of the positioning of the filamentary projections, embodiments of the invention are preferred in which the arrangement of the connecting filament strands and of the filamentary projections is determined by a structure of adhesion islands (first embodiment of the invention) and/or islands of the flowable substance (second embodiment of the invention) that are provided on the pattern face. The term "adhesion island" denotes here each locally delimited area on the pattern face whose ability to be moistened with the flowable substance is elevated in comparison to the remaining pattern face or on which a preferred moistening by the flowable substance is given. Adhesion contacts are advantageously formed during the contacting of the fluid face and the pattern face between the substance and the adhesion islands. The flowable substance preferably adheres to the adhesion islands whereas the pattern face between the adhesion islands has a reduced adhesion capacity. The connecting filament strands are advantageously localized on the adhesion islands during the separation of the fluid face and the pattern face so that the geometric distribution of the connecting filament strands and after their breaking even the geometric distribution of the filamentary projections is given by the structure of the adhesion islands on the pattern face.

A particular advantage of the invention is that the arrangement of the filamentary projections can be precisely fixed by the use of a pattern face with a certain pattern of the adhesion islands or islands of the flowable substance. The filamentary projections can be arranged, e.g., with a regular, e.g., quadratic grid structure, depending on the function of the structured surface or of the component in accordance with the invention. Alternatively, the density of the adhesion islands or islands of the flowable substance and therewith the density of the filamentary projections can be changed along the pattern face so that the structured surface can be produced with an areal density gradient of the filamentary projections. The provision of the adhesion islands or of the islands of the flowable substance means a pre-structuring with which the arrangement of the filamentary projections is controlled on the base face. The pre-structuring is advantageously simple and can be economically realized over a large area.

A further advantage of the first embodiment of the invention consists in the high variability in designing of the adhesion islands. In general, an adhesion island can differ from the immediate surroundings by its topography and/or its chemical composition. If, according to the first variant, the adhesion islands are formed by a topographical structure of the pattern face, this results in advantages in terms of the defined delimitation and reciprocal alignment of the adhesion islands. The topographical structure preferably comprises local elevations of the pattern face that contact the flowable substance at first during the reciprocal approach of the fluid face and the pattern face. Advantages results in this instance as concerns the exclusive moistening of the adhesion islands. The elevations are preferably formed by a local stepped formation such as, e.g., by particles or layers on the pattern face. Alternatively, the topographical structure can be formed by a filamentary projection or a part of the latter that was produced in accordance with the invention in a preparation process on the pattern face. The topographical structure comprises alternatingly local recesses of the pattern face, e.g., in the form of cavities that receive the flowable substance upon the contacting of the fluid face and the pattern face.

If, according to the second variant, the adhesion islands comprise chemically modified areas of the pattern face, this can result in advantages for an improvement of the adhesion contact between the substance and the pattern face. The chemically modified areas can be adapted specifically to the substance from which the filamentary projections are produced in order to achieve a good local adhesion. Substances for providing chemically modified adhesion islands are preferably the materials of the projections to be drawn or materials that establish a bond with the material of the projections to be drawn on account of their polarity or apolarity. In the first case the adhesion islands comprise the flowable substance. Examples for the second alternative are Y—$(COOH)_x$, Y—$(NH)_x$-$NH_2$, Y—$(CH_2)_x$, methylmethacrylates, Y—OH, and metals such as, e.g., gold and silver (Y: functional chemical component that combines with the material of the pattern face, e.g., thiols with an OH group for bonding on Au or with silane groups for the reactive formation of an ester connection with a glass surface).

According to a further variant the adhesion islands can be formed by a topographical structure comprising a chemical modification on the elevations or graduations. The provision of a chemically modified topographical structure has the particular advantage of an elevated flexibility in the selection of the participating materials, especially on the one hand of the material of the pattern face and on the other hand of the flowable substance.

The adhesion islands form the bases of the connecting filament strands on the side of the pattern face. Thus, a certain cross-sectional form can be advantageously impressed on the connecting filament strands and the filamentary projections as a function of the shape of the adhesion islands. For example, circular adhesion islands can be used in order to produce filamentary projections with a circular cross-section. For provision an anisotropy of the mechanical properties of the filamentary projections, e.g., of the Young module of the filamentary projections, e.g., elliptical or angular adhesion islands can be used as an alternative.

The second embodiment of the invention advantageously provides a structured component in which the filamentary projections are directly connected to the pattern- or stamp face without an additional topographic and/or chemical modification. In this case the following different variants can advantageously be realized. According to a first variant the islands of the flowable substance are permanently connected to the pattern face. The flowable substance and the material of the pattern face are chemically compatible with one another, that is, in particular can be mixed in the molten state and/or are suitable for establishing chemical compounds, e.g., by addition reactions. A chemical compound is preferably given between the flowable substance and the pattern face, e.g., by thermal or photochemical radical coupling (e.g., via acrylate groups) or by partial etching of the flowable substance and of the material of the pattern face (e.g., by solvent vapors). Special advantages for a reliable connection result if the flowable substance and the material of the pattern face have the same chemical composition. During the drawing out of the islands of the flowable substance after the contacting of the pattern face and of the stamp face and the subsequent separation movement the filamentary projections are formed on the pattern face. In the second variant the filamentary projections are formed on the solid-body face in that a chemical compound is produced between the flowable substance and the solid-body face during the contacting of the solid-body- and pattern faces. In this case the islands of the flowable substance must establish only an adherent connection with the pattern face. A chemical compound is not necessary. Accordingly, in the second variant the chemical composition of the flowable substance and of the material of the solid-body face is preferably identical.

In the second embodiment of the invention the islands of the flowable substance are preferably formed by colloidal polymer particles. They have special advantages in the positioning of the flowable substance on the pattern face and the adjustment of the flow behavior, e.g., as a function of an operating temperature. The polymer particles preferably consist of meltable polymers such as, e.g., polystyrene or polyacrylates. For the production of fine structures, particles with a diameter in the range of 50 nm to 20 μm, especially 100 nm to 10 μm are preferably used.

According to an especially preferred feature of the invention a hardening of the flowable substance is provided in the production of the filamentary projections. The term "hardening" denotes here a solidification of the substance until it is stable in form. After the hardening an additional stabilizing of the projections, e.g., by a cover layer can advantageously be omitted. The hardening takes place in accordance with a first variant during the spreading of the connecting filament strands. In this case the drawing of the connecting filament strand is advantageously terminated automatically by a tearing off the connecting filament strand as soon as the substance is sufficiently hardened. According to a second variant it can be provided that the hardening of the substance is not provided until after the interruption of the connecting filament strands. In this case advantages can result relative to the reproducibility in the adjustment of the length of the filamentary projections.

Different hardening processes can advantageously be used individually or in combination. During an evaporation of a solvent out of the substance of the connecting filament strand the hardening advantageously takes place without additional measures. Furthermore, a solidification of the substance by a cooling off or a cross-linking of the substance can be provided. The cross-linking comprises a change of the inner structure of the connecting filament strand by a chemical or physical effect such as, e.g., a reaction between different components of the flowable substance that is initiated by an irradiation.

According to a further advantageous feature of the invention the pattern face that is provided with the adhesion islands and/or the islands of the flowable substance, forms a base element from which the filamentary projections extend. This advantageously creates a stable component that can be immediately used for the further application.

Alternatively, the filamentary projections are provided on the fluid face of the flowable substance. In this case the hardening of the substrate comprises not only a stabilization of the filamentary projections but also a transformation of the fluid face into a solid layer that forms the base element for the filamentary projections in this embodiment. The base element and the filamentary projections advantageously consist here of the same material.

According to a further modification of the invention a forming of the filamentary projections can be provided during the hardening of the substance, especially after the interruption of the connecting filament strands, as a function of an external physical or chemical action. For example, polymers with a temperature- or pH-dependent surface tension or specific dielectric or magnetic properties can be used as flowable substance. In this case the filamentary projections can be deformed, e.g., by tempering or the provision of a certain pH in the environment or electrical and/or magnetic fields, in particular during the hardening.

A further advantage of the invention consists in the high flexibility in the selection of a shape of the filamentary projections. For example, straight or curved filamentary projections can be formed depending on the desired application of the structured surface. If, according to the first variant the separation movement of the fluid face and of the pattern face takes place along a straight reference line, the connecting filament strands are correspondingly spread in a straight manner. They can be, for example, vertical or inclined relative to the adjacent faces, e.g., the fluid face or the pattern face. The straight filamentary projections can be hardened during the drawing or thereafter. For the second variant the separating movement of the fluid face and of the pattern face takes place along a straight, oblique-angled or curved reference line, so that bent, angled or even twisted projections are produced. In this case the hardening takes place during the drawing of the connecting filament strands.

If, according to a further modification of the invention, a variation of the speed of the spreading of the connecting filament strands is provided, an additional thickness gradient can be advantageously produced along the length of the filamentary projections. If the speed of the separating movement of the fluid face and of the pattern face is low at first, the connecting filamentary strands have a greater thickness at first then at a later point in time with a higher speed of the separating movement.

According to a preferred variant of the invention, the flowable substance contains at least one polymer compound such as, e.g., at least one organic polymer or at least one organically/inorganically composed polymer. The using of at least one polymer compound has the advantage of a particularly simple control of the hardening by solvent removal or tempering. Preferably used polymers are polydimethylsiloxane (PDMS) (hardenable with additive component), polyvinylpyridine, polystyrene, polyphosphazenes and polyethyleneglycol. Alternatively, the flowable substance contains at least one type of cross-linkable monomers (with unsaturated carbon bonds) such as, e.g., acrylates, methacrylates, alkenes, nitriles and other monomeric mixtures of two components to a polyaddition, polycondensation or the like.

If, according to a further variant of the invention, the flowable substance contains at least one additive substance with which at least one of the chemical, dielectrical, optical and magnetic properties of the filamentary projections can be modified, special advantages result for the adjustment of a predetermined form of the projections during the production of the structured surface or during the application of the structured surface. According to the invention dynamic surface structures that can be controlled by external actions can be provided. The filamentary projections contain as additive substance, e.g., magnetic colloids or colloids with special dielectric properties. Furthermore, e.g., polyvinylpridine can be used as additive substance that swells in aqueous-acidic solution while it contracts in a neutral medium.

According to a further variant of the invention a tip treatment of the filamentary projections can be provided. The tip treatment comprises a creation of thickenings on the free ends of the filamentary projections. The tip treatment is provided after the interruption of the connecting filament strands. The tip treatment comprises, for example, a local heating of the free ends of the filamentary projections so that spherical thickenings form on them. According to a further variant a coating of the filamentary projections is provided, e.g., by vacuum vapor deposition. Finally, according to a further variant of the invention the filamentary projections can be embedded in a cover layer. In this case, given suitable substance selection a hardening of the filamentary projections can be omitted.

Preferred applications of surfaces structured in accordance with the invention consist in the formation of adhering surfaces and in the gas storage. The gas storage is made possible by the dynamic-mechanical properties of the filamentary projections. The pressure of an external liquid can be compensated by a deformation of the projections and a moistening changed therewith so that gases can be stored under liquid layers on substances structured in accordance with the invention. This effect is known as plastron effect from the nature and was observed, e.g., with certain underwater animals (see, e.g., D. J. Crisp in "Discussions of the Faraday Society London" vol. 3, 1948, pp. 210 220).

Further details and advantages of the invention are apparent from the following description of the attached drawings, which show in.

Figure 1:
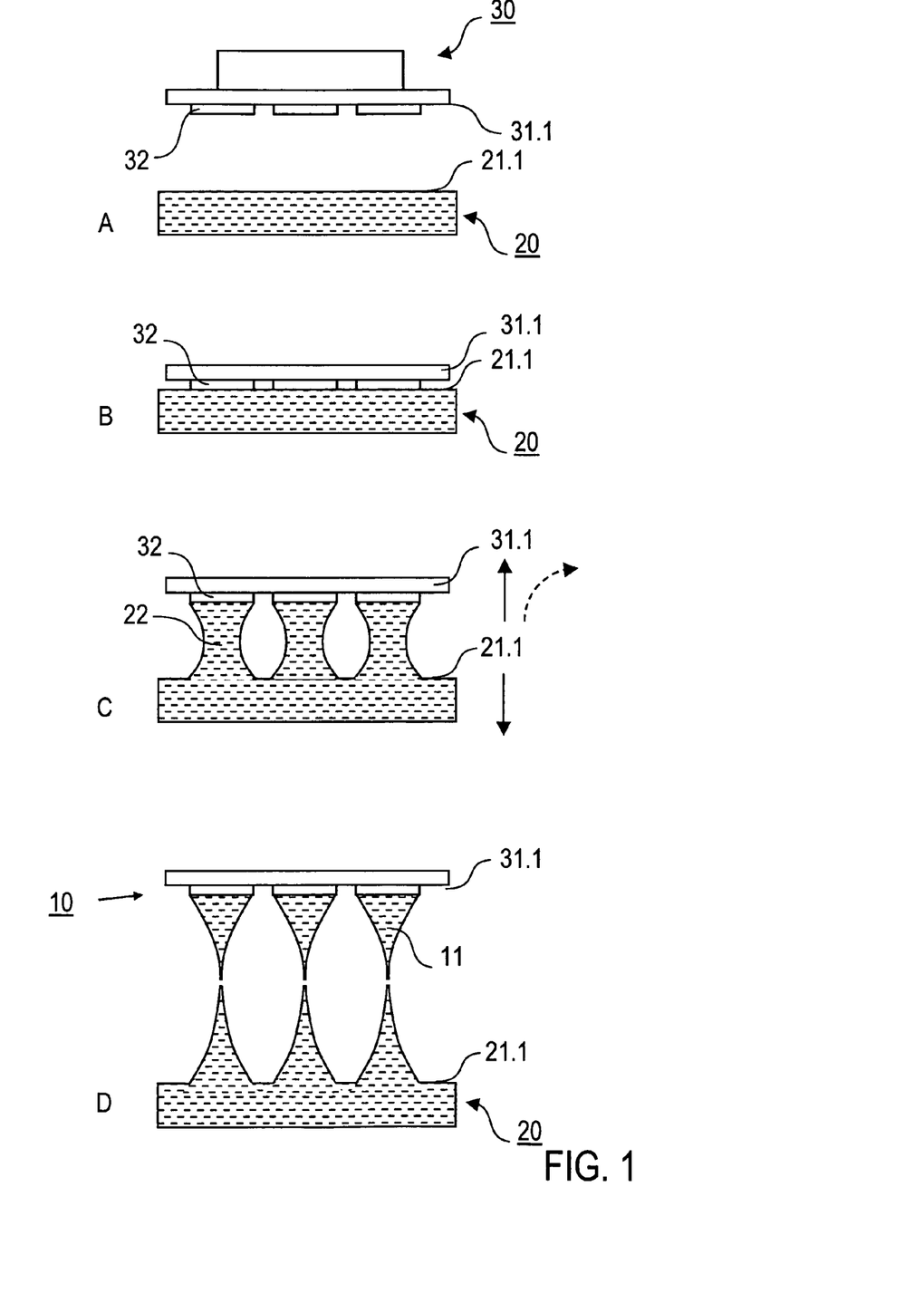
FIG. 1 a schematic illustration of the first embodiment of the method in accordance with the invention for producing a structured surface.
Figure 2:
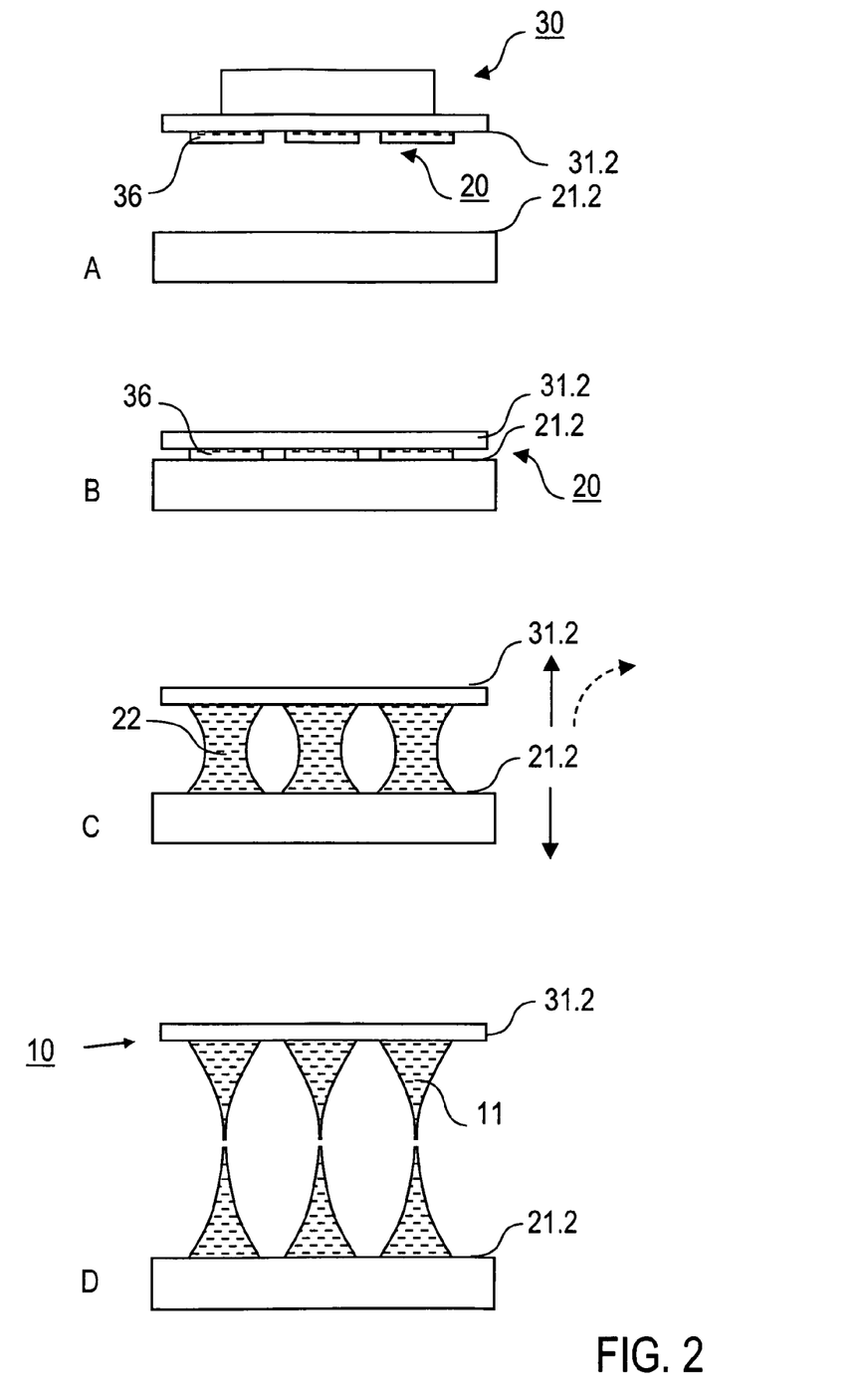
FIG. 2 a schematic illustration of the second embodiment of the method in accordance with the invention for producing a structured surface.

The Figures show schematic enlarged illustrations that are not true to scale. In particular, FIGS. 1 and 2 show the production of a series of only three projections whereas in the practice line-shaped or areal arrangements of filamentary projections are produced in a significantly higher number. Furthermore, the projections can have another form in the practice in which in particular a tapering is given on the base of the projections over a slight length whereas the remaining length of the diameters of the projections is substantially constant.

FIGS. 1A to 1D illustrate the production of a structured surface 10 with a plurality of filamentary projections 11 in accordance with the first embodiment of the invention. FIG. 1A shows a preparatory step in which a flowable substance 20 and a drawing device 30 with a pattern face 31.1 are provided and are aligned relative to one another. The substance 20 is located with a free fluid face 21.1, e.g., in a container. The drawing device 30 (FIG. 1A) comprises a drive device and a tempering device (not shown, see FIG. 6), with which the pattern face 31.1 can be moved and tempered. The pattern face 31.1 faces the fluid face 21.1. Both faces are aligned level and parallel to one another, the pattern face 31.1 carries adhesion islands 32 that serve as template for the formation of the filamentary projections 11.

The pattern face 31.1 comprises, e.g., a plate-shaped substrate of an organic substance or of an inorganic substance (e.g., plastics, especially PDMS, polystyrene, epoxy, PMMA, acrylate, ceramics metal, semiconductor, especially Au, Ag, TiO2, ZnO2, Si, SiO2, carbon-based or reinforced composite material). The adhesion islands 31.1 comprise e.g., particles with a diameter of 4 nm, e.g., of gold (so-called gold nanopoints) up to the µm range (e.g., 100 µm), e.g., of colloids of polystyrene, SiO2, TiO2. The adhesion islands 31.1 can be formed by a process of self-organization on the surface, e.g., of polymers of substances that are photolithographically produced and/or applied with stamps.

In the state according to FIG. 1A the flowable substance can still be solid at first. In this case the preparatory step comprises a heating of the substance 20 with a heating device (not shown, see FIG. 6) to a temperature above the melting- or softening temperature of the substance 20.

It can be provided deviating from the illustration according to FIG. 1 that the container or the carrier with the flowable substance 20 is connected to a drawing device in order to carry out a positioning and movement of the fluid face 21.1 relative to the pattern face 31.1.

The flowable substance 20 is located in a container, e.g., a dish, or as thin layer on the carrier, e.g., of glass or a polymer foil. By way of example, polyvinylpyridine (PVP) ($M_w$=60.000 g/mol) is dissolved with a concentration of ca. 20 wt % in ethanol. The PVP solution is applied as thin layer onto a glass surface and dried. The dried PVP layer is subsequently heated in order to soften the polymer. For example, PVP is heated to ca. 60 to 140° C.

Figure 14:
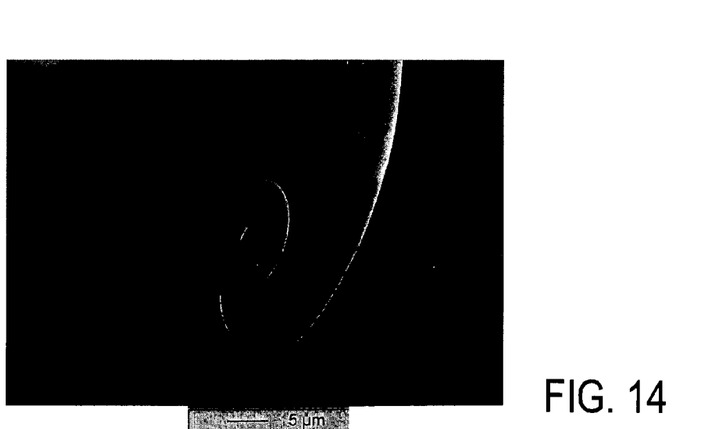

The pattern face 31.1 is approached according to FIG. 1B to the fluid face 21.1 until the adhesion islands 32 of at least a part of the pattern face 31.1 contact the substance 20. A group of adhesion islands 32 contacts the fluid face 21.1 at the same time. This group can comprise, e.g., all adhesion islands 32 of the pattern face 31.1 or, when using a curved pattern face 31.1, for example on a roller (see FIG. 14), one or more rows of adhesion islands 32. Since the thickness of adhesion islands 32 is, e.g., 10 nm, the pattern face 31.1 can contact the fluid face 21.1 in such a manner that only the adhesion islands 32 are moistened by the substance 20. Alternatively, however, the pattern face 31.1 can also completely contact or even be immersed into the fluid face 21.1 since the substance 20 adheres better to the adhesion islands 32 than in the areas located between them.

A separating movement of the fluid face 21.1 and of the pattern face 31.1 relative to one another subsequently takes place in accordance with FIG. 1C. As a rule, the pattern face 31.1 is withdrawn, alternatively or additionally even the fluid face 21.1 can be moved (see arrows). The movement takes place, by way of example, vertically or as shearing movement (see dotted-line arrow and FIG. 14) relative to the plane of the fluid face 21.1. The speed is selected as a function of the material properties and of the desired projection shape and is selected in the range of 0.1 millimeter per second to 10 millimeters per second in the case of the above-indicated PVP layer. The adhesion with the flowable substance 20 remains preserved on the surfaces of the adhesion islands 32, so that connecting filament strands 22 are spread between the adhesion islands 32 and the fluid face 21.1.

During the separation movement the elevated temperature of the flowable substance 20 (PVP melt) is maintained, while the pattern face 31.1 is at room temperature or a work temperature that is adjusted with the tempering device of the drawing device. The work temperature can deviate from the room temperature. The tempering device can also be provided for cooling. Thus, a temperature gradient is given between the pattern face 31.1 and the substance 20. An hardening of the connecting filament strand 22 takes place already during the separation movement starting from the adhesion islands 31.1 in accordance with the course of the temperature gradient. At the same time, a minimal surface is set by the surface tension of the material that is still flowable during the drawing as contour that is distinguished in particular by a tapering of the connecting filament strands 22 with increasing distance from the pattern face 31.1.

As a result of the drawing apart of the pattern face 31.1 and of the flowable substance 20, the latter adheres to the adhesion islands 32. The substance 20, e.g., the polymer PVP, solidifies during or after the drawing procedure by the evaporation of the solvent and/or the cooling off of the polymer melt. The connecting filament strands 22 (polymer filaments) form, whose starting points on pattern face 31.1 are given by the arrangement of the adhesion islands 32 and whose orientation generally depends on the drawing direction of the pattern face 31.1. The form, length and further properties such as, e.g., mechanical and optical properties can be determined by the draw rate and the physical properties of the substance 20 such as, e.g., the composition, the molecular weight, the degree of cross linking of the polymer, the viscosity or the viscoelastic properties of the substance 20 as well as by the rate of solidification (hardening) of the substance. The concretely realized operating parameters can be selected or optimized by experiments, if necessary. During continued separation movement a separation of the connecting filament strands occurs, so that the filamentary projections 11 remain on the pattern face 31.1. The elevations from the fluid face 21.1 sink back into the dissolved or molten substance 20.

The FIGS. 2A to 2D show the corresponding method course in accordance with the second embodiment of the invention. It differs from the first embodiment by the provision of the flowable substance 20 in the form of islands 36 on pattern face 31.2 and the formation of the opposite stamp face as solid-body face 21.2. By a movement course analogous to the steps described above with reference to FIGS. 1A to 1D, at first, a reciprocal contacting of the stamp face 21.2 and of the pattern face 31.2 with the islands 36 (FIG. 2B) takes place, and subsequently a separation movement takes place so that the connecting filament strands 22 are spread (FIG. 2C). The hardening of the connecting filament strands 22 takes place during the separation movement, whereas an interruption takes place in the area of the smallest diameter so that the filamentary projections 11 remain on the stamp face 21.2 and/or on the pattern face 31.2

If the pattern face 31.2 is chemically compatible with the flowable substance 20 and can form a chemical compound, the islands 36 are fixed on the pattern face 31.2. The islands 36 comprise, e.g., polystyrene particles with a diameter of 200 nm that are connected to the pattern face 31.2 of polystyrene by partial dissolving. In general, the flowable substance 20 and the material of the pattern face 31.2 are selected in such a manner that the melting temperature of the pattern face 31.2 is higher than that of the flowable substance 20. This condition can advantageously be fulfilled with polymer particles in that the particle-shaped islands 36 and the material of pattern face 31.2 have the same chemical composition but different chain lengths of the polymers. The solid-body face 21.2 consists of a metal (e.g., copper, steel or an alloy of them), whose temperature during the contacting of the pattern- and stamp faces is elevated in order to liquefy the flowable substance 20. Alternatively, the solid-body face 21.2 can consist of a ceramic material or glass. As a result of the separation movement the filamentary projections are created preferably on the pattern face 31.2.

Alternatively, the flowable substance 20 and the pattern face 31 consist of chemically non-compatible materials. For example, particle-shaped islands 36 of a liquefiable polymer are applied on a metallic pattern face 31.2 (e.g., copper, steel or an alloy of them). The islands 36 adhere to the pattern face 31.2 without being chemically bound to it. The solid-body face 21.2 consists of a material with which the flowable substance 20 can form a chemical compound. During the contacting of the pattern- and stamp faces (FIG. 2B) the flowable substance 20 is connected to the solid-body face 21.2. At the same time the flowable substance 20 is heated via the pattern- and/or solid-body faces. The connection of the flowable substance 20 with the solid-body face 21.2 comprises, e.g., a partial melting or a chemical coupling, e.g., a photochemical cross-linking. The drawing out of the connecting filament strands and their interruption for forming the filamentary projections subsequently take place.

The following description of method variants refers to examples in accordance with the first embodiment of the invention. The corresponding features can be realized analogously even with the second embodiment.

Figure 3:
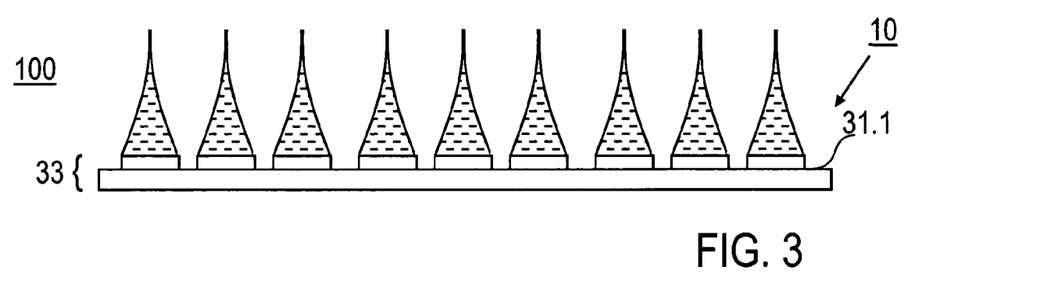
FIGS. 3 to 7 different variants of components in accordance with the invention with structured surfaces.
Figure 4:
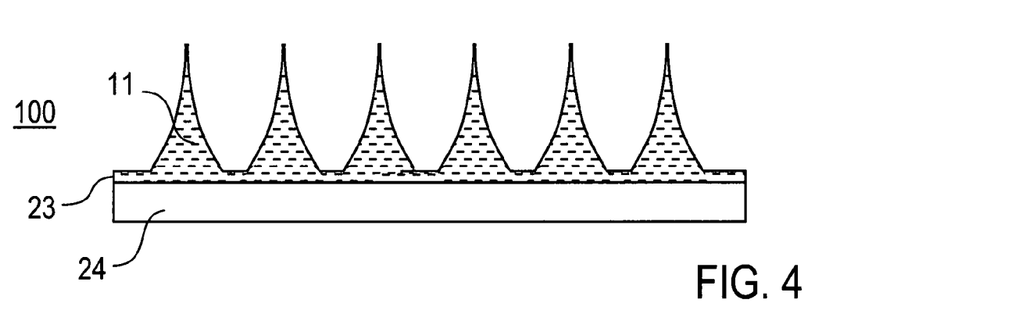
Figure 5:
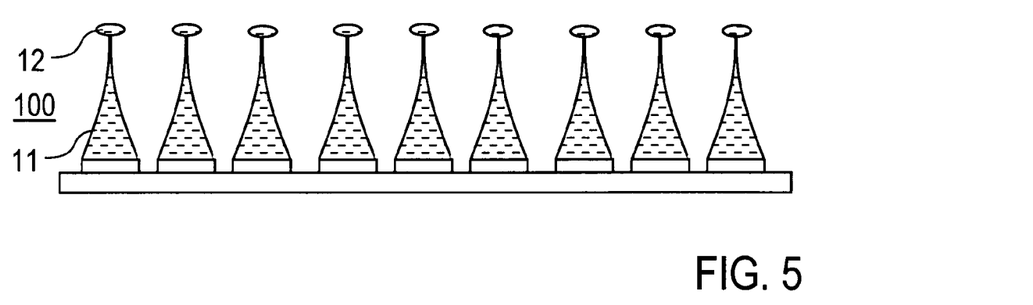
Figure 6:
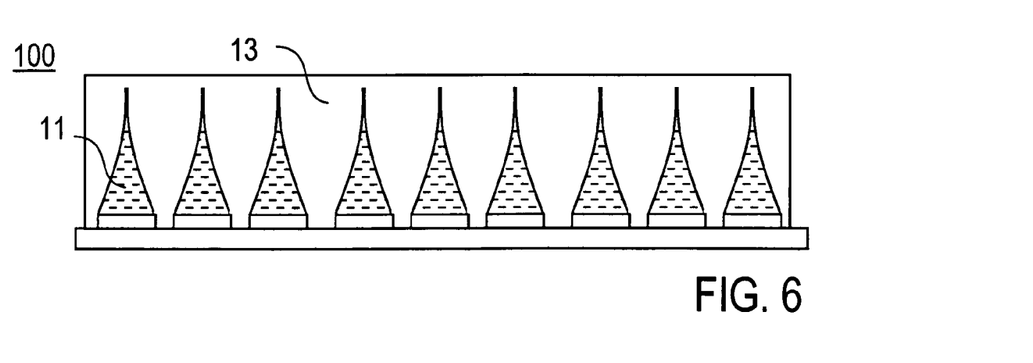

The component 100 in accordance with the invention with the structured surface 10 comprises according to FIG. 3 as base element 33 the pattern face 31.1 on which the filamentary projections 11 are arranged. FIGS. 4 to 6 illustrate further variants of the component 100 in accordance with the invention. According to FIG. 4 even the surface of the substance 20 is hardened during the drawing of the connecting filament strands 22 (see, e.g., FIG. 1C), e.g. by a cooling off or a removal of solvent so that filamentary projections 11 form on the fluid phase converted to the solid base element 23. The base element 23 is stabilized on a carrier 24. In this case the component 100 comprises the carrier 24 with the base element 23 and the filamentary projections 11.

FIGS. 5 and 6 show further processing steps after the completion of component 100. According to FIG. 5 the creation of thickenings 12 on the free ends of the projections 11 is provided. According to FIG. 6 the projections 11 are covered with a covering layer 13. This embodiment is of interest, for example, for optical applications of structured surfaces in which the projections 11 are to be protected from environmental influences. A processing step after the completion of the component 110 can alternatively or additionally comprise a hardening of the projections by an irradiation.

Figure 7:
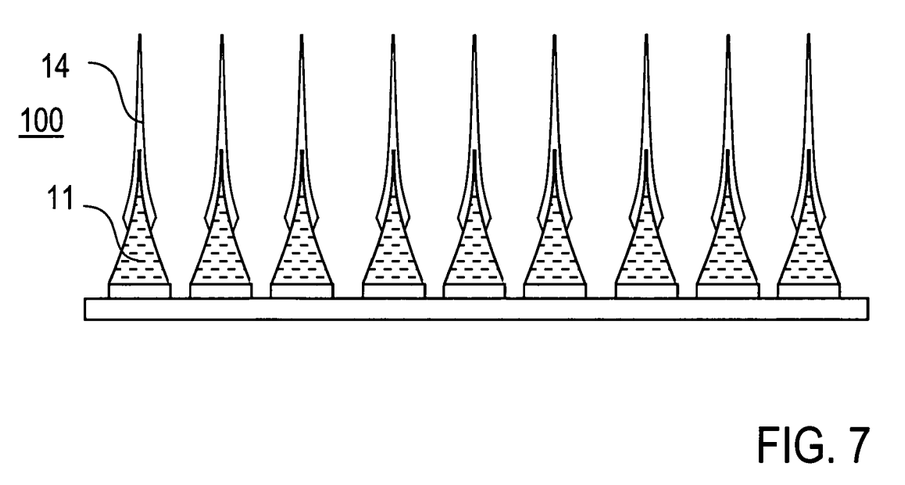

FIG. 7 illustrates a further variant of the invention in which the projections 11 are formed in a multi-layer manner. To this end the method illustrated above is multiply carried out, whereas the particular formed projections are used as adhesion islands for the subsequent drawing out of filaments. The lengthening 14 of the projection 11 can be formed of the same material as the projection 11 or of a different material.

Figure 8:
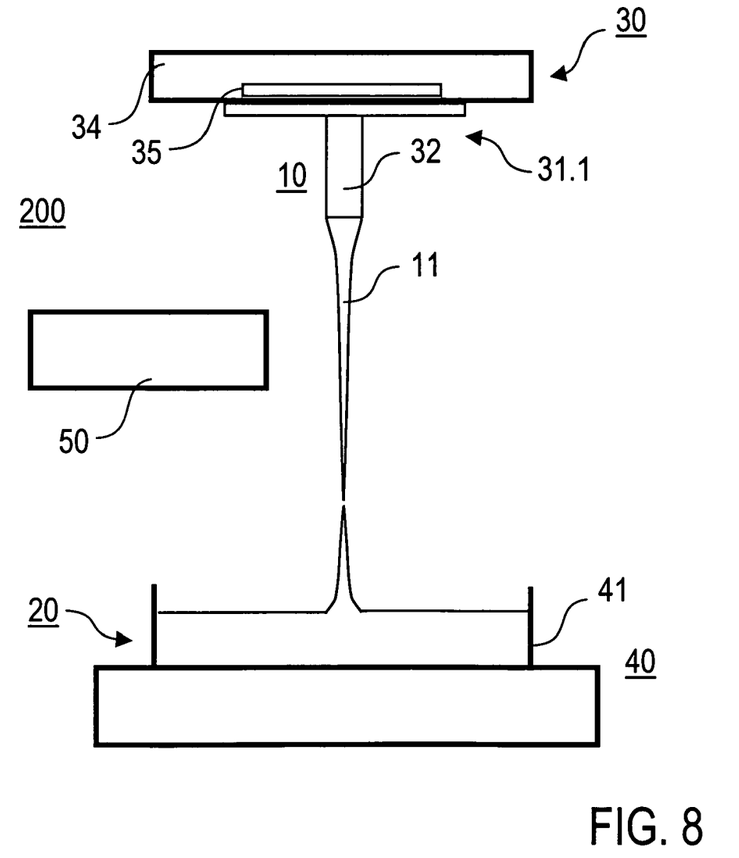
FIG. 8 a schematic illustration of an apparatus for producing a structured surface in accordance with the invention.

FIG. 8 schematically shows an apparatus 200 for the production of a structured surface 10 of which a variant of the pattern face 31.1 is shown for reasons of clarity with only one single projection 11 on the adhesion island 32. The apparatus 200 comprises the drawing device 30 with the drive device 34 and the tempering device 35, a heating device 40 with a carrier or container 41 for receiving the flowable substance 20 and optionally a conditioning device 50 with which the form of the connecting filament strands and of projections 11 can be influenced during the drawing procedure.

The drive device 34 serves to align and move the pattern face 31.1. To this end, e.g., a stepping motor is provided. The tempering device 35 and the heating device 40 contain, e.g., resistance heatings.

The conditioning device 50 contains, e.g., a magnet (permanent magnet or electromagnet) for producing a magnetic field under the action of which a curvature of the projections 11 is formed. To this end the substance 20 contains a magnetic additive substance such as, e.g., magnetic colloids. Alternatively, an electrical field for influencing the projection form can be produced with the conditioning device 50. A special advantage of the invention consists in that the conditioning device 50 acts simultaneously on all projections so that a uniform shaping can be achieved on all projections.

According to a further variant the conditioning device 50 can be adapted for a chemical influencing of the form of the projections 11. The structuring procedure with the drawing of the connecting filament strands 22 in accordance with FIG. 1 or 2 does not obligatorily have to take place in a gaseous environment but rather can alternatively also be provided in a liquid. Curved projections can also be produced by adjusting the pH of the liquid after the interruption of the connecting filament strands but before the termination of the hardening. The structuring of the surface in a liquid in accordance with the invention has advantages in comparison to the process of a gaseous environment for the temperature control, the ability to control the escape of solvent from the drawn filaments of the flowable substance and by the mechanical separation of the projections, in particular in projections with a high surface density.

Figure 9:
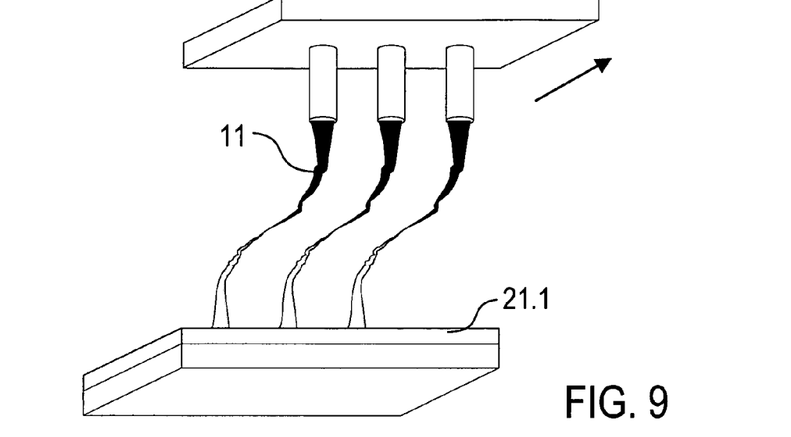
FIG. 9 a schematic illustration of the production of a filamentary projection with a curvature.

FIG. 9 illustrates by way of example the production of curved projections 11 by a drawing direction deviating from the surface normal (see arrow). The separation movement takes place along a straight or curved reference line relative to the fluid face 21.1. The drawing direction can be changed during the separation movement in order to influence the orientation and/or form of the projections.

Figure 10:
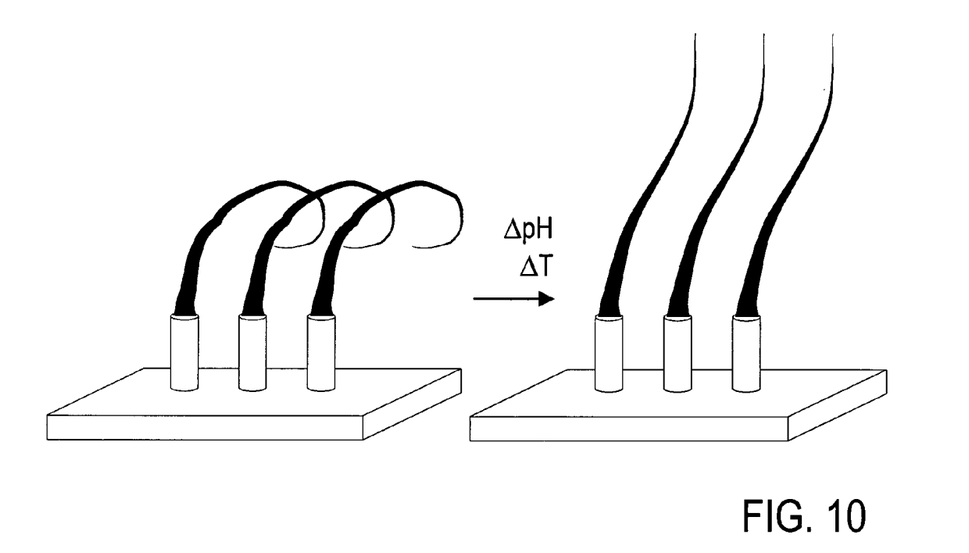
FIG. 10 a schematic illustration of an actuatable surface structure in accordance with the invention.

Curved projections can advantageously be used for surfaces that can be dynamically switched, as is schematically illustrated in FIG. 10. If, for example, curved projections of PVP are present in accordance with FIG. 9 in a neutral surrounding medium, they straighten out by a changing of the pH in an acidic medium. A corresponding switching movement can also be achieved by a temperature change. This switching can be of interest for optical or sensor-technical applications of structured surfaces.

Figure 11:
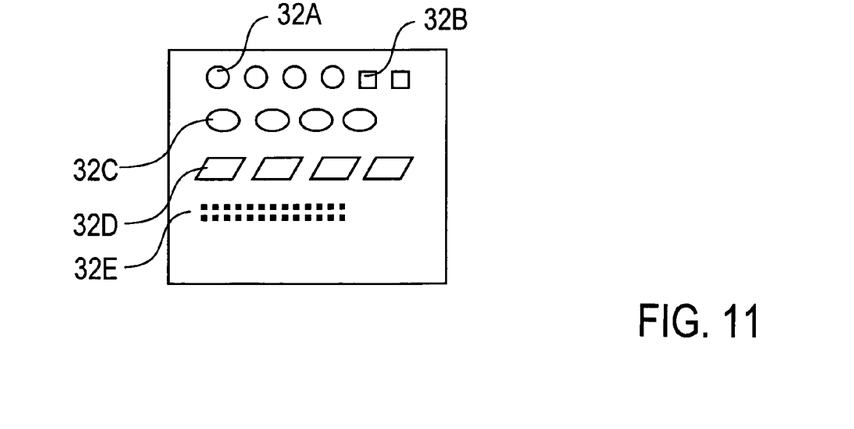
FIG. 11 different variants of adhesion islands used in accordance with the invention.
Figure 12:
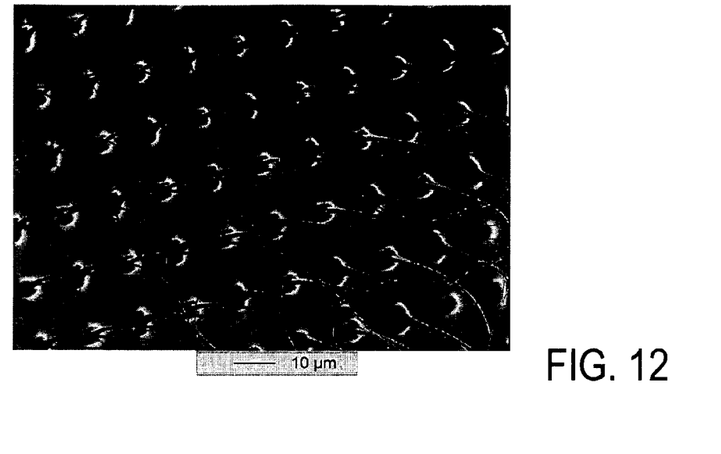
FIGS. 12 to 14 photographic representations of surface structures produced in accordance with the invention.
Figure 13:
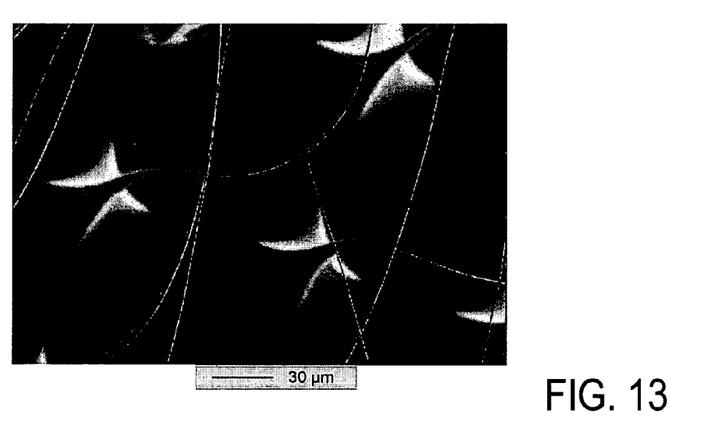

FIG. 11 shows different variants of adhesion islands in schematic top view. Alternatively to circular or quadratic bases 32A, 32B, in order to produce mechanical anisotropies of the structured surface, in particular bases with one or more preferred directions such as, e.g., elliptical bases 32C or rhombus-shaped bases 32D can be provided. The reference numeral 32E refers, for example, to punctiform adhesion islands. If the adhesion islands alternatively comprise bases with more than four corners, this can result in advantages for the mechanical stability of the filaments drawn in accordance with the invention.

FIGS. 11 to 14 illustrate electron-microscopic images of surface structures of polyvinylpyridine produced in accordance with the invention. In accordance with FIG. 14, according to the invention even projections with windings are produced that can form in the hardening of polymers during an extreme shearing movement.

Figure 15:
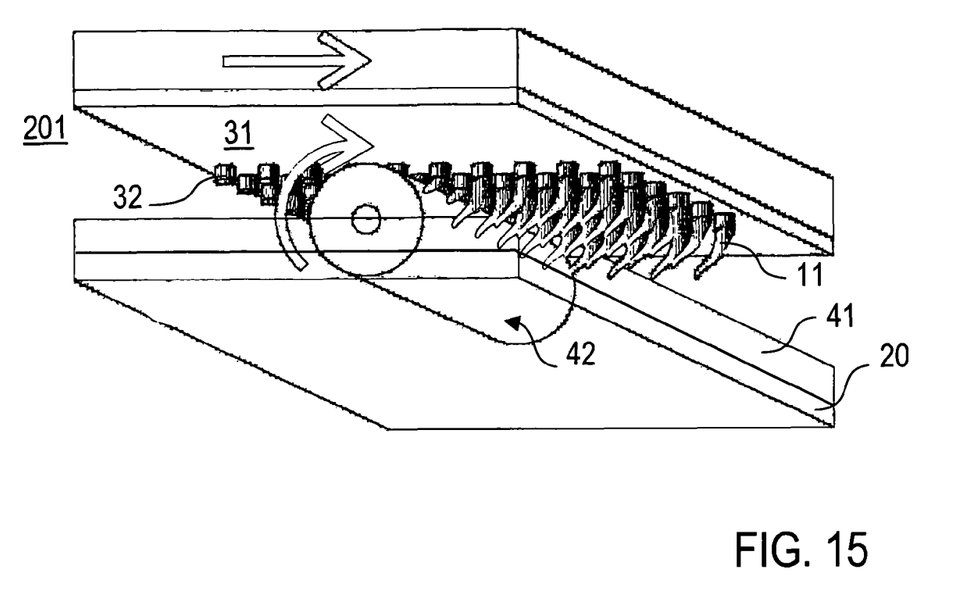
FIG. 15 a schematic illustration of a further apparatus for producing a structured surface in accordance with the invention.

FIG. 15 schematically shows details of a further embodiment of an apparatus 201 for producing a structured surface 10 with curved projections 11. This embodiment is especially well-suited for the production of endless material with a surface structured in accordance with the invention. The apparatus contains a roller 42 that is immersed into the container 41 with the flowable substance 20 and contacts the pattern face 31.1 with the adhesion islands 32 outside of the container 41. The heating device for the container 41 and/or the roller 42 and the optional conditioning device (see FIG. 8) are not shown.

A drive device (for example, a motor, not shown) is provided for moving the pattern face 31.1 in the direction of the arrow while rotating the roller 42. Due to the rotation of the roller 42, a layer of the flowable substance 20 is formed on its cylindrical surface, the free fluid face of which faces the pattern face 31.1. As a result, the adhesion islands 32 execute a shearing motion relative to the fluid face of the flowable substance 20 with which the form of the connecting filament strands and of the projections 11 (shown enlarged) can be influenced during the drawing procedure. The pattern face 31.1 can be arranged as shown on the carrier or alternatively can be guided past the roller 42 with a further roller.

The features of the invention disclosed in the previous description, the drawings and the claims can be significant individually as well as in combination for the realization of the invention in its different embodiments.

The invention claimed is:

1. A method for producing a structured surface comprising a plurality of filamentary projections, comprising the steps:
   mutual contacting of a stamp face and a pattern face, whereas the stamp face is formed by a fluid face of the flowable substance, and the pattern face comprises adhesion islands, and whereas the flowable substance adheres to the adhesion islands upon the contacting of the fluid face with the pattern face,
   separation movement of the stamp face and of the pattern face, whereas connecting filament strands of the flowable substance are drawn between the stamp face and the pattern face, and
   interruption of the connecting filament strands so that the filamentary projections are formed on the pattern face.

2. The method according to claim 1, wherein the adhesion islands are formed by at least one of topographical structures of the pattern face and areas of the pattern face, which areas having a chemical modification.

3. The method according to claim 2, wherein the topographical structures of the pattern face are formed by local steps or pre-formed filaments or a combination of them.

4. The method according to claim 3, wherein the steps are formed by a deposition of particles or layers on the pattern face.

5. The method according to claim 1, wherein the filamentary projections are formed on the fluid face, which fluid face is converted into a solid base layer.

6. A method for producing a structured surface comprising a plurality of filamentary projections, comprising the steps:

mutual contacting of a stamp face and a pattern face, whereas the stamp face is formed by a solid-body face and the pattern face carries islands of the flowable substance, whereas the substance adheres to the solid-body face upon the contacting of the solid-body face with the pattern face, separation movement of the stamp face and of the pattern face, whereas connecting filament strands of the flowable substance are drawn between the stamp face and the pattern face, and interruption of the connecting filament strands so that the filamentary projections are formed on at least one of the stamp face and the pattern face.

7. The method according to claim 6, wherein the islands of the flowable substance are connected to the pattern faceand the filamentary projections are formed on the pattern face.

8. The method according to claim 7, wherein the pattern faceand the flowable substance have the same chemical composition.

9. The method according to claim 6, wherein the flowable substance is connected with the solid-body faceupon the contacting of the solid-body faceand of the pattern face, and the filamentary projections are formed on the solid-body face.

10. The method according to claim 9, wherein the solid-body face and the flowable substance have the same chemical composition.

11. The method according to claim 4, wherein the particles comprise colloidal polymer particles.

12. The method according to claim 11, wherein the colloidal polymer particles have a diameter in the range of 50 nm to 20 μm.

13. The method according to claim 1, wherein a hardening of the substance is provided.

14. The method according to claim 13, wherein the hardening of the substance takes place at least one of during the drawing and after the interruption of the connecting filament strands.

15. The method according to claim 13, wherein the hardening of the substance comprises at least one of the processes that comprise an evaporation of a solvent out of the substance, a solidification of the substance by a cooling off and a cross-linking of the substance.

16. The method according to claim 13, wherein comprising the step of forming of the filamentary projections by an external action during the hardening of the substance.

17. The method according to claim 1, wherein the separation movement is a straight movement and straight filamentary projections are formed.

18. The method according to claim 1, wherein the separation movement is a curved movement and curved filamentary projections are formed.

19. The method according to claim 1, wherein comprising a step of varying the speed of the stamp face and of the pattern face relative to one another during the separation movement.

20. The method according to claim 1, wherein the flowable substance comprises at least one of an organic polymer, an organic-inorganically composed polymer or cross-linkable monomer.

21. The method according to claim 1, wherein the flowable substance contains at least one additive substance with which the chemical, dielectrical, optical or magnetic properties of the filamentary projections can be modified.

22. The method according to claim 1, comprising a step of a tip treatment of the filamentary projections.

23. The method according to claim 5, wherein the adhesion islands or the particles are arranged with a predetermined geometric distribution that is impressed to the connecting filament strands during the drawing movement.

24. The method according to claim 6, wherein a hardening of the substance is provided.

25. The method according to claim 6, wherein the separation movement is a straight movement and straight filamentary projections are formed.

26. The method according to claim 6, wherein the separation movement is a curved movement and curved filamentary projections are formed.

27. The method according to claim 6, wherein comprising a step of varying the speed of the stamp face and of the pattern face relative to one another during the separation movement.

28. The method according to claim 6, wherein the flowable substance comprises at least one of an organic polymer, an organic-inorganically composed polymer or cross-linkable monomer.

29. The method according to claim 6, wherein the flowable substance contains at least one additive substance with which the chemical, dielectrical, optical or magnetic properties of the filamentary projections can be modified.

30. The method according to claim 6, comprising a step of a tip treatment of the filamentary projections.

* * * * *